United States Patent
Yang

(10) Patent No.: US 10,054,369 B2
(45) Date of Patent: Aug. 21, 2018

(54) ADJACENTLY-INSTALLED TEMPERATURE EQUALIZER WITH SINGLE SIDE HEAT TRANSFERRING

(71) Applicant: Tai-Her Yang, Dzan-Hwa (TW)

(72) Inventor: Tai-Her Yang, Dzan-Hwa (TW)

( * ) Notice: Subject to any disclaimer, the term of this patent is extended or adjusted under 35 U.S.C. 154(b) by 522 days.

(21) Appl. No.: 14/066,156

(22) Filed: Oct. 29, 2013

(65) Prior Publication Data
US 2015/0114612 A1 Apr. 30, 2015

(51) Int. Cl.
| | |
|---|---|
| F28F 3/12 | (2006.01) |
| F28D 1/06 | (2006.01) |
| H01L 23/34 | (2006.01) |
| H01L 23/427 | (2006.01) |
| H01L 23/473 | (2006.01) |
| F28D 21/00 | (2006.01) |

(52) U.S. Cl.
CPC .......... *F28D 1/06* (2013.01); *F28F 3/12* (2013.01); *F28D 2021/0028* (2013.01); *F28F 2270/00* (2013.01); *H01L 23/34* (2013.01); *H01L 23/427* (2013.01); *H01L 23/473* (2013.01); *H01L 2924/0002* (2013.01)

(58) Field of Classification Search
CPC ......... B30B 15/064; F28F 3/12; H01L 23/473
See application file for complete search history.

(56) References Cited

U.S. PATENT DOCUMENTS

| | | | | |
|---|---|---|---|---|
| 3,317,798 | A * | 5/1967 | Chu | G06F 1/20 165/122 |
| 5,130,768 | A * | 7/1992 | Wu | H01L 23/4006 257/712 |
| 6,129,260 | A * | 10/2000 | Andrus | B23K 1/0016 228/120 |
| 6,367,543 | B1 * | 4/2002 | Calaman | F28F 3/022 165/134.1 |
| 6,729,383 | B1 * | 5/2004 | Cannell | F28F 3/022 165/185 |
| 9,010,407 | B2 * | 4/2015 | Mackenzie | E03C 1/00 165/141 |
| 9,297,571 | B1 * | 3/2016 | Correa | F25D 19/00 |

\* cited by examiner

*Primary Examiner* — Len Tran
*Assistant Examiner* — Gordon Jones
(74) *Attorney, Agent, or Firm* — Bacon & Thomas, PLLC

(57) ABSTRACT

The present invention provides an adjacently-installed temperature equalizer with single side heat transferring formed with a heat transferring adjacent surface and a heat insulation surface oriented towards the exterior and a fluid channel transferring heat with the passing fluid, wherein one or more than one adjacently-installed temperature equalizer with single side heat transferring is adjacently installed at a selected location at the exterior and/or the interior of a temperature equalizing object, and through pumping the external fluid for cooling or heating, the fluid is enabled to pass the heat transferring adjacent surface of the adjacently-installed temperature equalizer with single side heat transferring for transferring the cooling or heating thermal energy to the temperature equalizing object; and beside a thermal energy transferring surface (1005), other opened surfaces are respectively formed with a heat insulation layer (1010) for preventing or reducing the heat transfer of radiating, transferring and convecting to the exterior.

15 Claims, 6 Drawing Sheets

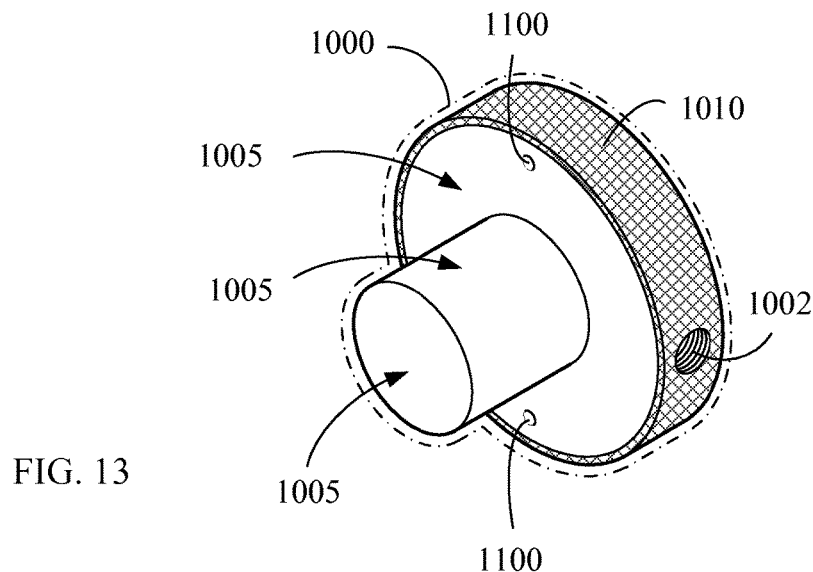
FIG. 13
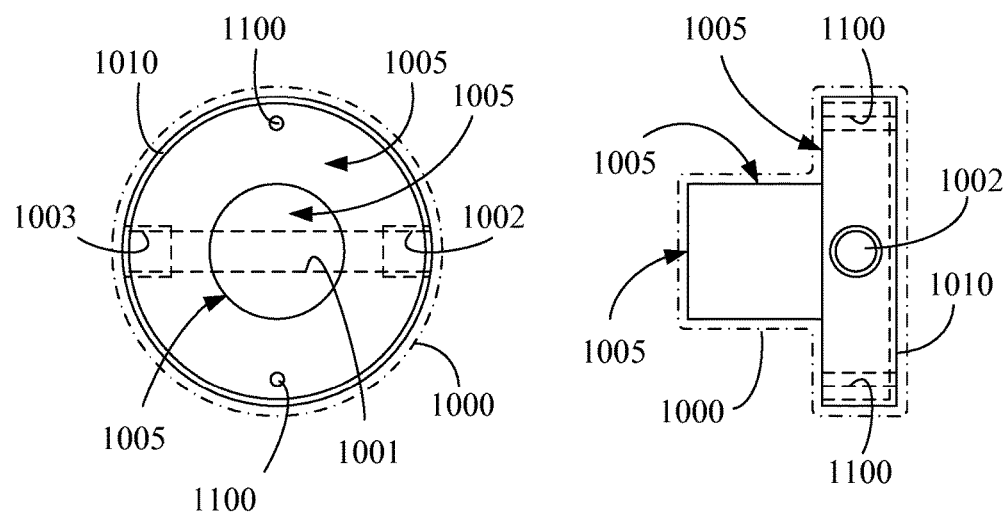
FIG. 14
FIG. 15

ADJACENTLY-INSTALLED TEMPERATURE EQUALIZER WITH SINGLE SIDE HEAT TRANSFERRING

BACKGROUND OF THE INVENTION (a) Field of the Invention

The present invention provides an adjacently-installed temperature equalizer with single side heat transferring formed with a heat transferring adjacent surface and a heat insulation surface oriented towards the exterior and a fluid channel transferring heat with the passing fluid, wherein one or more than one adjacently-installed temperature equalizer with single side heat transferring is adjacently installed at a selected location at the exterior and/or the interior of a temperature equalizing object, and through pumping the external fluid for cooling or heating, the fluid is enabled to pass the heat transferring adjacent surface of the adjacently-installed temperature equalizer with single side heat transferring for transferring the cooling or heating thermal energy to the temperature equalizing object; and beside a thermal energy transferring surface (1005), other opened surfaces are respectively formed with a heat insulation layer (1010) for preventing or reducing the heat transfer of radiating, transferring and convecting to the exterior.

(b) Description of the Prior Art

In a conventional adjacently-installed temperature equalizing member which allows a fluid to pass the penetrated fluid channel formed inside the temperature equalizing member, except for the adjacent surface, other surfaces are often provided with a function of transferring, convecting and radiating thermal energy to the exterior.

SUMMARY OF THE INVENTION

In a conventional adjacently-installed temperature equalizing member which allows a fluid to pass the penetrated fluid channel formed inside the temperature equalizing member, except for the adjacent surface, other surfaces are often provided with a function of transferring, convecting and radiating thermal energy to the exterior.

The present invention provides an adjacently-installed temperature equalizer with single side heat transferring formed with a heat transferring adjacent surface and a heat insulation surface oriented towards the exterior and a fluid channel transferring heat with the passing fluid, wherein one or more than one adjacently-installed temperature equalizer with single side heat transferring is adjacently installed at a selected location at the exterior and/or the interior of a temperature equalizing object, and through pumping the external fluid for cooling or heating, the fluid is enabled to pass the heat transferring adjacent surface of the adjacently-installed temperature equalizer with single side heat transferring for transferring the cooling or heating thermal energy to the temperature equalizing object; and beside a thermal energy transferring surface (1005), other opened surfaces are respectively formed with a heat insulation layer (1010) for preventing or reducing the heat transfer of radiating, transferring and convecting to the exterior.

BRIEF DESCRIPTION OF THE DRAWINGS

FIG. 13 is a perspective view illustrating the adjacently-installed temperature equalizer (1000) being formed with a columnar thermal energy transferring surface (1005) according to one embodiment of the present invention.

FIG. 14 is a front view of FIG. 13.

FIG. 15 is a side view of FIG. 13.

DESCRIPTION OF MAIN COMPONENT SYMBOLS

1000: Adjacently-installed temperature equalizer
1001: Fluid channel
1002, 1003: Fluid inlet/outlet port
1004: Pipeline
1005: Thermal energy transferring surface
1010: Heat insulation layer
1100: Fasten hole

DETAILED DESCRIPTION OF THE PREFERRED EMBODIMENTS

In a conventional adjacently-installed temperature equalizing member which allows a fluid to pass the penetrated fluid channel formed inside the temperature equalizing member, except for the adjacent surface, other surfaces are often provided with a function of transferring, convecting and radiating thermal energy to the exterior;

The present invention provides an adjacently-installed temperature equalizer with single side heat transferring formed with a heat transferring adjacent surface and a heat insulation surface oriented towards the exterior and a fluid channel transferring heat with the passing fluid, wherein one or more than one adjacently-installed temperature equalizer with single side heat transferring is adjacently installed at a selected location at the exterior and/or the interior of a temperature equalizing object, and through pumping the external fluid for cooling or heating, the fluid is enabled to pass the heat transferring adjacent surface of the adjacently-installed temperature equalizer with single side heat transferring for transferring the cooling or heating thermal energy to the temperature equalizing object; and beside a thermal energy transferring surface (1005), other opened surfaces are respectively formed with a heat insulation layer (1010) for preventing or reducing the heat transfer of radiating, transferring and convecting to the exterior.

Figure 1:
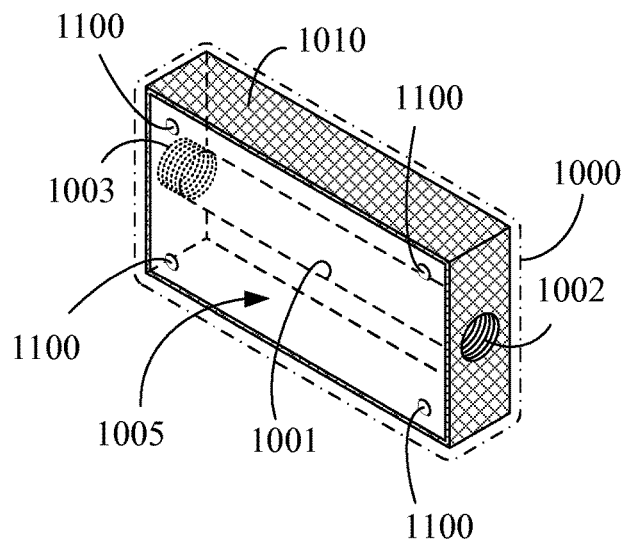
FIG. 1 is a perspective view illustrating the adjacently-installed temperature equalizer (1000) being formed in a block-like structure having single fluid channel (1001) according to one embodiment of the present invention.

FIG. 1 is a perspective view illustrating the adjacently-installed temperature equalizer (1000) being formed in a block-like structure having single fluid channel (1001) according to one embodiment of the present invention.

Figure 2:
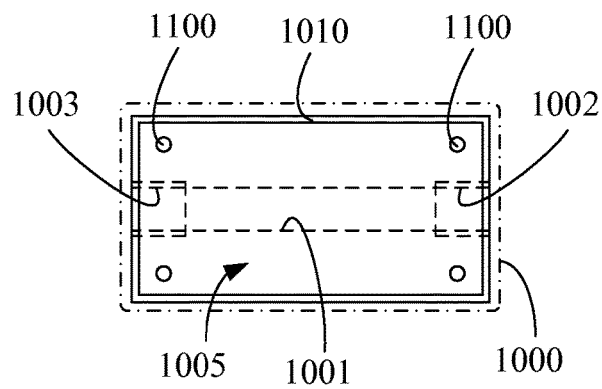
FIG. 2 is a front view of FIG. 1.

FIG. 2 is a front view of FIG. 1.

Figure 3:
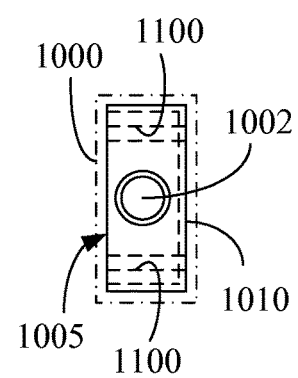
FIG. 3 is a side view of FIG. 1.

FIG. 3 is a side view of FIG. 1.

As shown in FIG. 1, FIG. 2 and FIG. 3, the adjacently-installed temperature equalizer (1000) is made of a material having better heat transferring property, such as gold, silver, copper, aluminum, magnesium aluminum alloy, iron or ceramic, and formed with a fluid channel (1001), and a fluid inlet/outlet port (1002) and a fluid inlet/outlet port (1003) at two ends of the fluid channel (1001) for being connected with a pipeline for allowing the gaseous, or liquid, or gaseous converting into liquid or liquid converting into gaseous fluid to be inputted or outputted; the fluid channel (1001) is formed with a thermal energy transferring surface (1005), and beside the thermal energy transferring surface (1005), other opened surfaces are respectively formed with a heat insulation layer (1010) for preventing or reducing the heat transfer of radiating, transferring and convecting to the exterior;

The means for adjacently installing the adjacently-installed temperature equalizer (1000) formed with single fluid channel (1001) on the object includes being fastened on a heat transferring structural surface of the object by a means of adhering, pressing, soldering, or riveting or screwing through fasten holes (1100).

Figure 4:
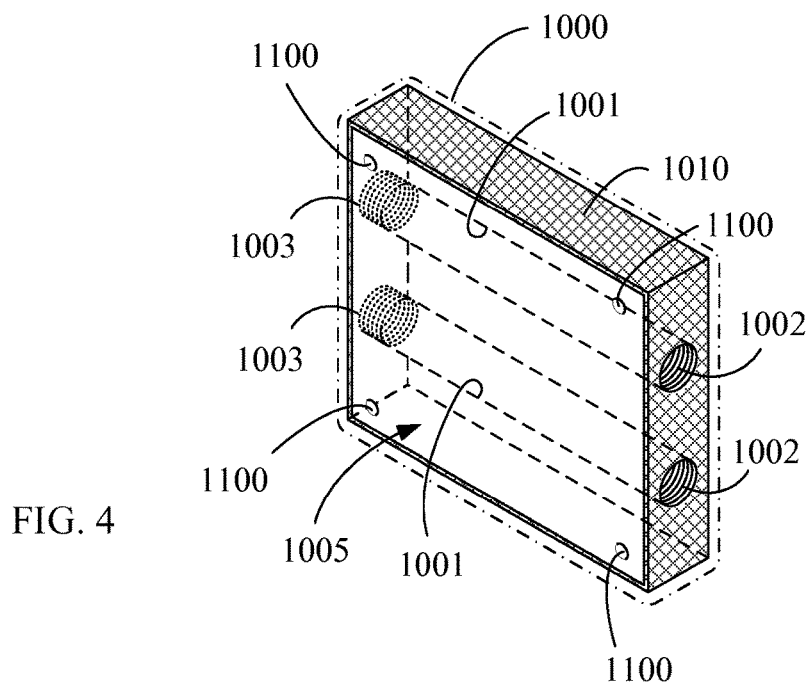
FIG. 4 is a perspective view illustrating the adjacently-installed temperature equalizer (1000) being formed in a block-like structure having two fluid channels (1001) according to one embodiment of the present invention.

FIG. 4 is a perspective view illustrating the adjacently-installed temperature equalizer (1000) being formed in a block-like structure having two fluid channels (1001) according to one embodiment of the present invention.

Figure 5:
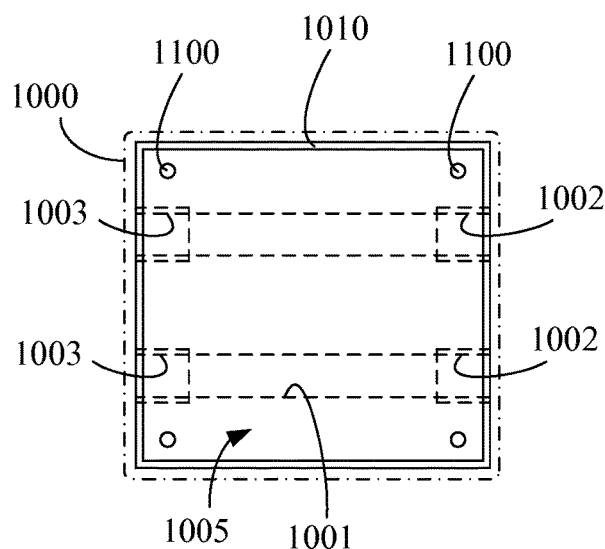
FIG. 5 is a front view of FIG. 4.

FIG. 5 is a front view of FIG. 4.

Figure 6:
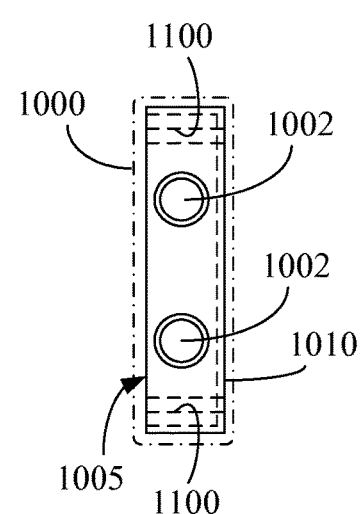
FIG. 6 is a side view of FIG. 4.

FIG. 6 is a side view of FIG. 4.

As shown in FIG. 4, FIG. 5 and FIG. 6, the adjacently-installed temperature equalizer (1000) is made of a material having better heat transferring property, such as gold, silver, copper, aluminum, magnesium aluminum alloy, iron or ceramic, and formed with two fluid channels (1001), and a fluid inlet/outlet port (1002) and a fluid inlet/outlet port (1003) at two ends of the fluid channel (1001) for being connected with a pipeline for allowing the gaseous, or liquid, or gaseous converting into liquid or liquid converting into gaseous fluid to be inputted or outputted; the fluid channel (1001) is formed with a thermal energy transferring surface (1005), and beside the thermal energy transferring surface (1005), other opened surfaces are respectively formed with a heat insulation layer (1010) for preventing or reducing the heat transfer of radiating, transferring and convecting to the exterior;

The means for adjacently installing the adjacently-installed temperature equalizer (1000) formed with two fluid channels (1001) on the object includes being fastened on a heat transferring structural surface of the object by a means of adhering, pressing, soldering, or riveting or screwing through fasten holes (1100).

Figure 7:
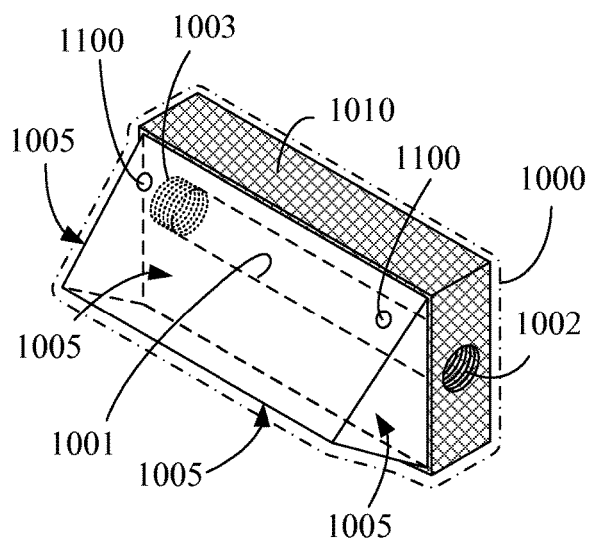
FIG. 7 is a perspective view illustrating the adjacently-installed temperature equalizer (1000) being formed in a block-like structure having four heat transferring adjacent surfaces according to one embodiment of the present invention.

FIG. 7 is a perspective view illustrating the adjacently-installed temperature equalizer (1000) being formed in a block-like structure having four heat transferring adjacent surfaces according to one embodiment of the present invention.

Figure 8:
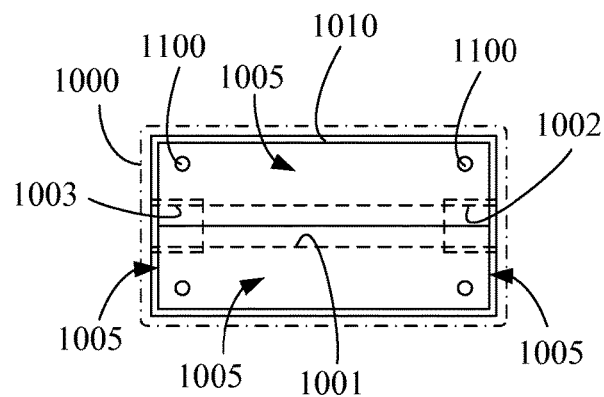
FIG. 8 is a front view of FIG. 7.

FIG. 8 is a front view of FIG. 7.

Figure 9:
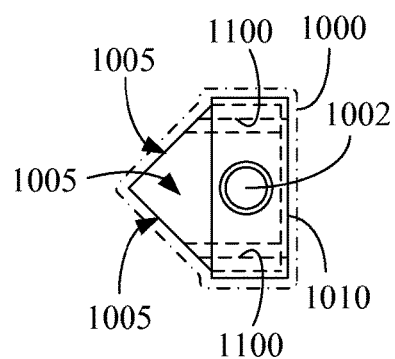
FIG. 9 is a side view of FIG. 7.

FIG. 9 is a side view of FIG. 7.

As shown in FIG. 7, FIG. 8 and FIG. 9, the adjacently-installed temperature equalizer (1000) is made of a material having better heat transferring property, such as gold, silver, copper, aluminum, magnesium aluminum alloy, iron or ceramic, and formed with a fluid channel (1001), and a fluid inlet/outlet port (1002) and a fluid inlet/outlet port (1003) at two ends of the fluid channel (1001) for being connected with a pipeline for allowing the gaseous, or liquid, or gaseous converting into liquid or liquid converting into gaseous fluid to be inputted or outputted; the fluid channel (1001) is formed with four thermal energy transferring surfaces (1005), and beside the four thermal energy transferring surfaces (1005), other opened surfaces are respectively formed with a heat insulation layer (1010) for preventing or reducing the heat transfer of radiating, transferring and convecting to the exterior;

The means for adjacently installing the adjacently-installed temperature equalizer (1000) formed with four heat transferring adjacent surfaces on the object includes being fastened on a heat transferring structural surface of the object by a means of adhering, pressing, soldering, or riveting or screwing through fasten holes (1100).

Figure 10:
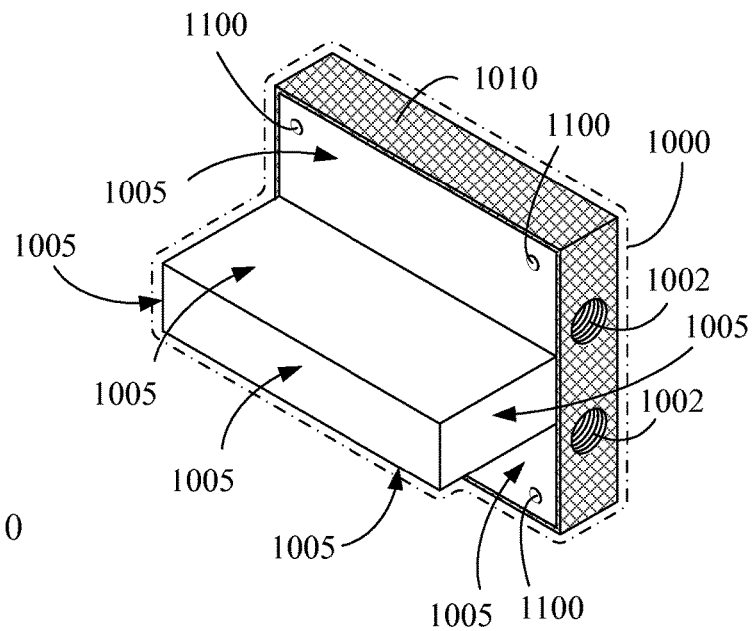
FIG. 10 is a perspective view illustrating the adjacently-installed temperature equalizer (1000) being formed in a block-like structure having plural heat transferring adjacent surfaces according to one embodiment of the present invention.

FIG. 10 is a perspective view illustrating the adjacently-installed temperature equalizer (1000) being formed in a block-like structure having plural heat transferring adjacent surfaces according to one embodiment of the present invention.

Figure 11:
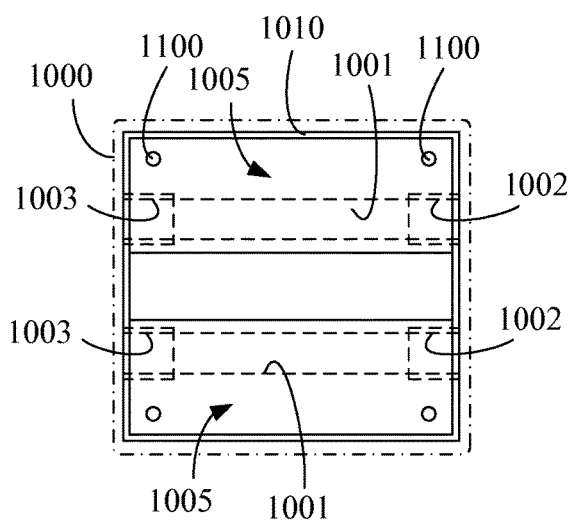
FIG. 11 is a front view of FIG. 10.

FIG. 11 is a front view of FIG. 10.

Figure 12:
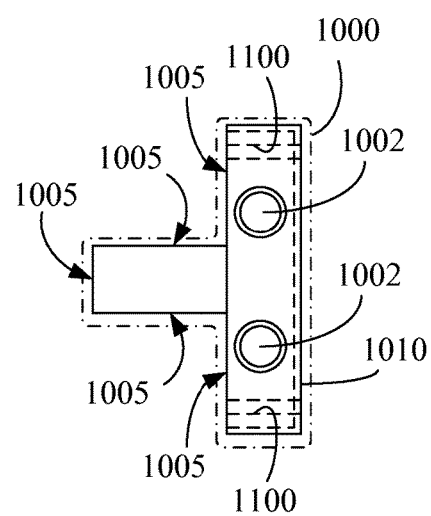
FIG. 12 is a side view of FIG. 10.

FIG. 12 is a side view of FIG. 10.

As shown in FIG. 10, FIG. 11 and FIG. 12, the adjacently-installed temperature equalizer (1000) is made of a material having better heat transferring property, such as gold, silver, copper, aluminum, magnesium aluminum alloy, iron or ceramic, and formed with a fluid channel (1001), and a fluid inlet/outlet port (1002) and a fluid inlet/outlet port (1003) at two ends of the fluid channel (1001) for being connected with a pipeline for allowing the gaseous, or liquid, or gaseous converting into liquid or liquid converting into gaseous fluid to be inputted or outputted; the fluid channel (1001) is formed with plural thermal energy transferring surfaces (1005), and beside the plural thermal energy transferring surfaces (1005), other opened surfaces are respectively formed with a heat insulation layer (1010) for preventing or reducing the heat transfer of radiating, transferring and convecting to the exterior;

The means for adjacently installing the adjacently-installed temperature equalizer (1000) formed in a block-like structure and having plural heat transferring adjacent surfaces on the object includes being fastened on a heat transferring structural surface of the object by a means of adhering, pressing, soldering, or riveting or screwing through fasten holes (1100).

FIG. 13 is a perspective view illustrating the adjacently-installed temperature equalizer (1000) being formed with a columnar thermal energy transferring surface (1005) according to one embodiment of the present invention.

FIG. 14 is a front view of FIG. 13.

FIG. 15 is a side view of FIG. 13.

As shown in FIG. 13, FIG. 14 and FIG. 15, the adjacently-installed temperature equalizer (1000) is made of a material having better heat transferring property, such as gold, silver, copper, aluminum, magnesium aluminum alloy, iron or ceramic, and formed with a fluid channel (1001), and a fluid inlet/outlet port (1002) and a fluid inlet/outlet port (1003) at two ends of the fluid channel (1001) for being connected with a pipeline for allowing the gaseous, or liquid, or gaseous converting into liquid or liquid converting into gaseous fluid to be inputted or outputted; the fluid channel (1001) is formed with a columnar thermal energy transferring surface (1005), and beside the thermal energy transferring surface (1005), other opened surfaces are respectively formed with a heat insulation layer (1010) for preventing or reducing the heat transfer of radiating, transferring and convecting to the exterior;

The means for adjacently installing the adjacently-installed temperature equalizer (1000) formed with the columnar thermal energy transferring surface (1005) on the object includes being fastened on a heat transferring structural surface of the object by a means of adhering, pressing, soldering, or riveting or screwing through fasten holes (1100).

Embodiments disclosed from FIG. 1 to FIG. 15 are served as illustrations for fully disclosing the present invention and shall not be limitations to the scope of the present invention, the structural shape and the quantity of fluid channel can be alternatively determined according to actual needs and under the same theory applied in the present invention.

The adjacently-installed temperature equalizer with single side heat transferring can be applied in a rechargeable battery or a liquid crystal display, a semiconductor substrate, a heat dissipater, an air conditioning heat exchanger, or a machine housing of a precision machine or a multi dimension measurement device, or a selected location at the exterior and/or the interior of the machine housing, through pumping the external heat transfer fluid for cooling or heating, the adjacently-installed object is enabled to be processed with the heat transfer for being cooled or heated, thereby preventing the working temperature of the semiconductor unit, the photovoltaic, the LED or the rechargeable battery or the liquid crystal display from being overly high or overly low and avoiding the performance deterioration; and/or when being applied in an electric motor, a power generator or a transformer with its loading getting greater or the environmental temperature getting higher, the overheating and performance deterioration and the burning damage can be prevented, when being applied in the precision machine or the multi dimension measurement device, the geometric shape of the machine housing can be ensured to be stable and the precision can also be ensured.

Figure 16:
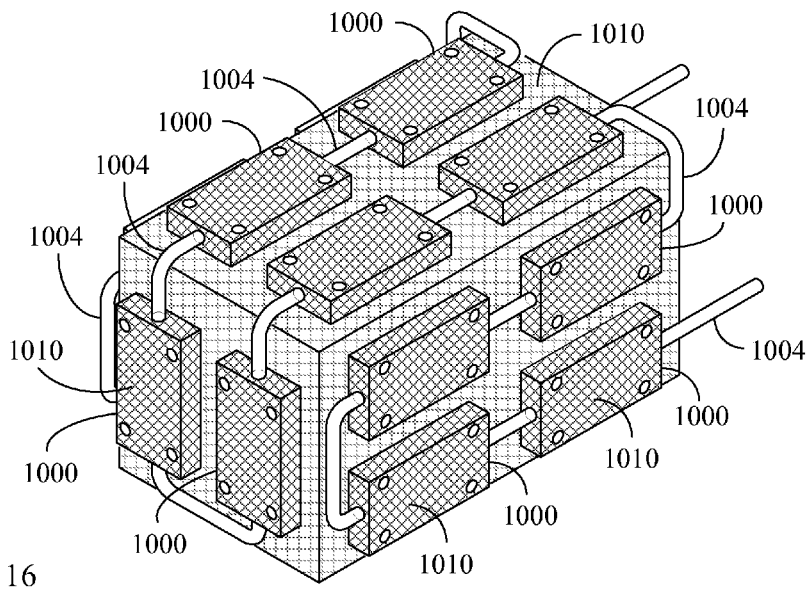
FIG. 16 is a schematic view illustrating one application of the present invention.

FIG. 16 is a schematic view illustrating one application of the present invention.

As shown in FIG. 16, the fluid channel (1001) of the adjacently-installed temperature equalizer (1000) through a pipeline (1004) connects in series on a surface of the object, so the fluid passing the fluid channel (1001) of each of the adjacently-installed temperature equalizers (1000) is enabled to transfer the thermal energy through the thermal energy transferring surface (1005) of the fluid channel (1001) to the surface of the object.

Figure 17:
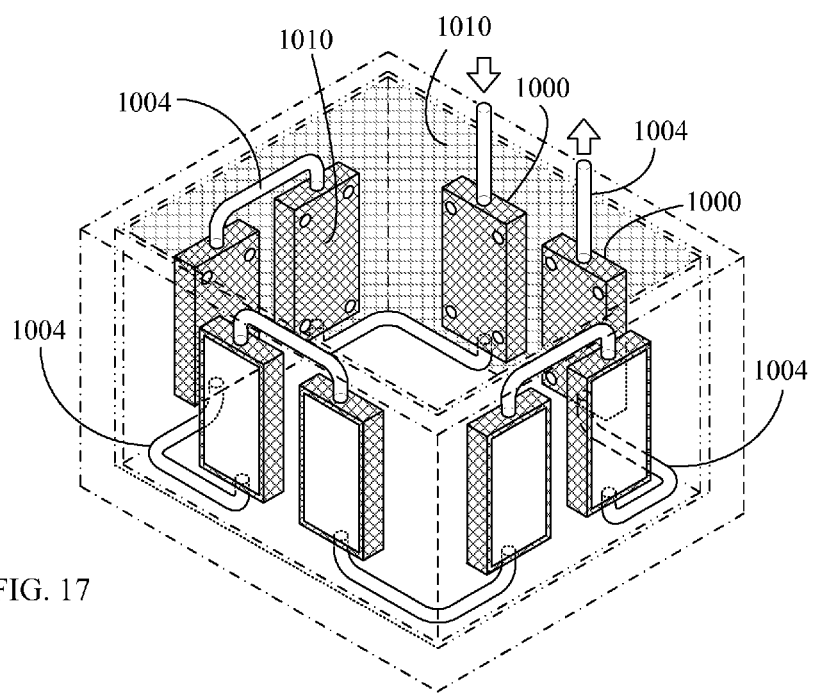
FIG. 17 is a schematic view illustrating another application of the present invention.

FIG. 17 is a schematic view illustrating another application of the present invention.

As shown in FIG. 17, the fluid channels (1001) of the adjacently-installed temperature equalizer (1000) through a pipeline (1004) connect in series on an internal surface of the object, so the fluid passing the fluid channel (1001) of each of the adjacently-installed temperature equalizers (1000) is enabled to transfer the thermal energy through the thermal energy transferring surface (1005) of the fluid channel (1001) to the internal surface of the object.

The invention claimed is:

1. An adjacently-installed temperature equalizer with single side heat transference, comprising:
    a temperature equalizing member (1000) having at least one thermal energy transferring surface (1005) and a plurality of additional surfaces on an exterior of the temperature equalizing member (1000), said at least one thermal energy transferring surface (1005) being arranged to contact an object to be heated or cooled by transfer of thermal energy to or from the object through the at least one thermal energy transferring surface (1005) on the exterior of the temperature equalizing member (1000); and
    at least one fluid channel (1001) passing through an interior of the temperature equalizing member (1000) between a first fluid inlet/outlet port (1002) in a first of the additional surfaces on one side of the temperature equalizing member (1000) and a second fluid inlet/outlet port (1003) in a second of the additional surfaces on a second side opposite the first side of the temperature equalizing member (1000), the at least one fluid channel (1001) being a bore extending through the temperature equalizing member (1000),
    wherein the temperature equalizing member (1000) is made of a thermally conductive material to transfer heat between the at least one thermal energy transferring surface (1005) and a thermally conductive fluid in the at least one fluid channel (1001), to thereby heat or cool an object fastened to the at least one thermal energy transferring surface (1005), the thermally conductive fluid being in contact with the temperature equalizing member (1000) as it flows through the fluid channel (1001), and
    wherein each of the additional surfaces of the temperature equalizing member (1000) that is not included in said at least one thermal energy transferring surface (1005) is insulated by a respective heat insulation layer (1010) to prevent or reduce gain or loss of heat through the respective additional surface.

2. The adjacently-installed temperature equalizer with single side heat transference as claimed in claim 1, wherein the temperature equalizing member (1000) is block-shaped.

3. The adjacently-installed temperature equalizer with single side heat transference as claimed in claim 1, wherein a material of the temperature equalizing member (1000) is one of a thermally conductive metal and a thermally conductive ceramic.

4. The adjacently-installed temperature equalizer with single side heat transference as claimed in claim 3, wherein a material of the temperature equalizing member (1000) is a thermally conductive metal selected from gold, silver, copper, aluminum, magnesium aluminum allow, and iron.

5. The adjacently-installed temperature equalizer with single side heat transference as claimed in claim 1, wherein the temperature equalizing member (1000) include fastening holes (1100) that at least extend through the at least one thermal energy transferring surface (1005) to fasten the object to be heated or cooled to the at least one thermal energy transferring surface (1005).

6. The adjacently-installed temperature equalizer with single side heat transference as claimed in claim 1, wherein the at least one first fluid inlet/outlet port (1002) and the at least one second fluid inlet/outlet port (1003) are arranged to be fastened to a pipeline for carrying the thermally conductive fluid into and away from the at least one fluid channel (1001).

7. The adjacently-installed temperature equalizer with single side heat transference as claimed in claim 6, wherein the thermally conductive fluid is at least one of a gas, a liquid, a gas that is condensed by transfer of thermal energy from the at least one fluid channel (1001) to the temperature equalizing member (1000), and a liquid that is vaporized by transfer of thermal energy from temperature equalizing member (1000) to the at least one fluid channel (1001).

8. The adjacently-installed temperature equalizer with single side heat transference as claimed in claim 1, wherein the at least one thermal energy transferring surface (1005) is adapted to be fastened to the object to be heated or cooled by an adhesive, pressing, soldering, riveting, or screwing.

9. The adjacently-installed temperature equalizer with single side heat transference as claimed in claim 1, further comprising at least one second said fluid channel (1001), first fluid inlet/outlet port (1002), and second fluid inlet/outlet port (1003).

10. The adjacently-installed temperature equalizer with single side heat transference as claimed in claim 1, wherein the temperature equalizing member (1000) includes an extension having a shape of a triangular prism with four said thermal energy transferring surfaces (1005).

11. The adjacently-installed temperature equalizer with single side heat transference as claimed in claim 1, wherein the temperature equalizing member (1000) has a main body that includes the fluid channel (1001) and has a block shape, and a block-shaped extension that extends from the at least one thermal energy transferring surface (1005) on the main body, the block-shaped extension providing five additional thermal energy transferring surfaces (1005).

12. The adjacently-installed temperature equalizer with single side heat transference as claimed in claim 1, wherein the temperature equalizing member (1000) is a disc-shaped member, and wherein the at least one thermal energy transferring surface (1005) is on one side of the disc-shaped member and one said heat insulation layer (1001) extends around a circumference of the disc-shaped member.

13. The adjacently-installed temperature equalizer with single side heat transference as claimed in claim 1, wherein the temperature equalizing member (1000) includes a cylindrical extension that extends from the at least one thermal energy transferring surface (1005) on one side of the disc-shaped member, and that includes a thermal energy transferring end surface (1005) and a thermal energy transferring cylindrical surface (1005).

14. The adjacently-installed temperature equalizer with single side heat transference as claimed in claim 1, wherein the temperature equalizing member (1000) is installed on an exterior surface of the object and connected in series to a plurality of additional temperature equalizing members (1000) installed on the exterior surface or on additional exterior surfaces of the object by pipeline sections (1004) connected to respective inlet/outlet ports (1002,1003) of the temperature equalizing members.

15. The adjacently-installed temperature equalizer with single side heat transference as claimed in claim 1, wherein the temperature equalizing member (1000) is installed on an interior surface of the object and connected in series to a plurality of additional temperature equalizing members (1000) installed on the interior surface or on additional interior surfaces of the object by pipeline sections (1004) connected to respective inlet/outlet ports (1002,1003) of the temperature equalizing members.

\* \* \* \* \*